(12) United States Patent
Oi

(10) Patent No.: US 7,199,598 B2
(45) Date of Patent: Apr. 3, 2007

(54) BURN-IN SUBSTRATE FOR SEMICONDUCTOR DEVICES

(75) Inventor: Kenichi Oi, Osaka (JP)

(73) Assignee: Espec Corp., Osaka (JP)

( * ) Notice: Subject to any disclaimer, the term of this patent is extended or adjusted under 35 U.S.C. 154(b) by 76 days.

(21) Appl. No.: 10/975,015

(22) Filed: Oct. 28, 2004

(65) Prior Publication Data
US 2005/0116223 A1 Jun. 2, 2005

(30) Foreign Application Priority Data
Nov. 27, 2003 (JP) .............................. 2003-396866

(51) Int. Cl.
*G01R 31/02* (2006.01)
(52) U.S. Cl. .................. 324/760; 324/765; 324/755
(58) Field of Classification Search ........ 324/754–765; 439/61–72, 91; 361/713, 784; 174/252
See application file for complete search history.

(56) References Cited

U.S. PATENT DOCUMENTS 5,672,981 A * 9/1997 Fehrman ..................... 324/760
5,825,171 A * 10/1998 Shin ........................... 324/73.1
6,181,146 B1 * 1/2001 Koyama ...................... 324/755

FOREIGN PATENT DOCUMENTS

| JP | 04-118984 | 4/1992 |
|---|---|---|
| JP | 09-068557 | 3/1997 |
| JP | 2000-221234 | 8/2000 |
| JP | 3392783 | 1/2001 |

* cited by examiner

*Primary Examiner*—Vinh P. Nguyen
(74) *Attorney, Agent, or Firm*—Harness, Dickey & Pierce

(57) ABSTRACT

Input and output of small-current signals between a mother board and semiconductor devices subjected to a burn-in test are made via a device driving unit. Large-current main power is supplied via the device driving unit through bus bars without passing through the mother board. In this way, the risk of burn-out in a burn-in substrate and burn-in sockets, and damages caused by a burn-out can be reduced even when it occurs.

5 Claims, 5 Drawing Sheets

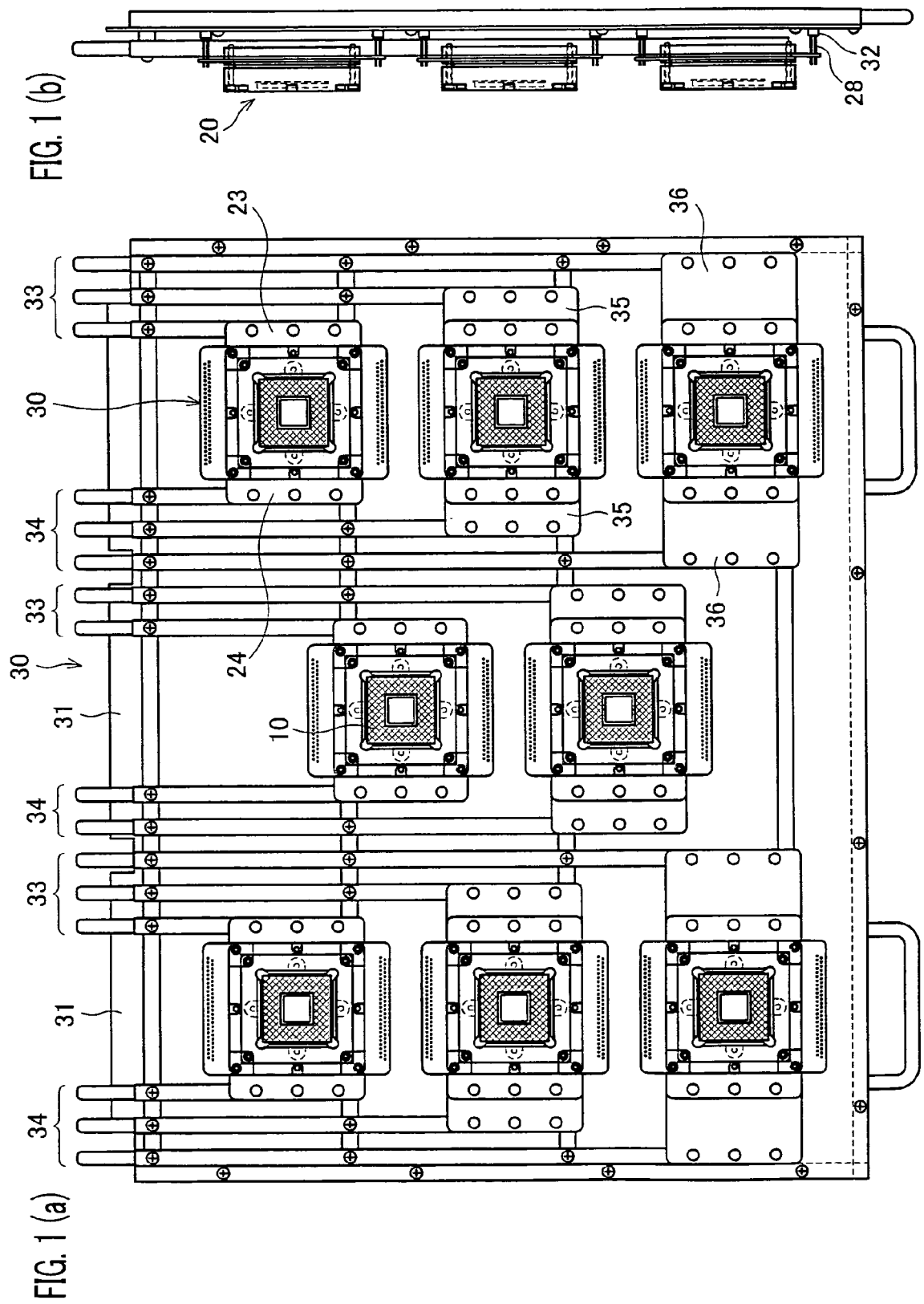

BURN-IN SUBSTRATE FOR SEMICONDUCTOR DEVICES

This Nonprovisional application claims priority under 35 U.S.C. § 119(a) on Patent Application No. 2003/396866 filed in Japan on Nov. 27, 2003, the entire contents of which are hereby incorporated by reference.

FIELD OF THE INVENTION

The present invention relates to a burn-in device that carries out a burn-in test on semiconductor devices to find initial failures therein, and relates to a burn-in substrate for installing semiconductor devices in the burn-in device.

BACKGROUND OF THE INVENTION

The operating current of recent CPUs (Central Processing Unit) has been increasing due to high integration as necessitated by their increasing processing capabilities. Moreover, in highly integrated CPUs, leakage current due to poor insulation caused by finer circuit patterns and so on has also been increasing, causing an increase in consumption current in the CPUs. Therefore, in recent years, semiconductor devices that consume a device driving power exceeding 100 amperes have been developed.

Since such high power devices (semiconductor devices that consume a large current) need large numbers of interconnections for device driving power ($V_{DD}$), ground (GND), and input and output signals, they are generally mounted in a package style called BGA (Ball Grid Array) or LGA (Land Grid Array).

In the semiconductor device employing BGA or LGA, a large number of electrode pads (device electrodes) are disposed in a matrix at the pitch of about 1 mm on the back face of the device substrate (opposite the mounting substrate).

Generally, semiconductor devices go through discrimination tests to see if each semiconductor is a good product or a defective product, and also they go through a test called a burn-in to find initial failures. In a burn-in, the semiconductor devices are placed under a heavier load than usual.

In a burn-in test, semiconductors are mounted on burn-in sockets that are arranged on a burn-in substrate. The burn-in substrate is realized by a multi-layer printed board which is prepared by patterning electrode pads on its front face in the same matrix pattern as the device electrodes, wherein the electrode pads are provided with wiring for $V_{DD}$, GND, and input and output signals.

The burn-in sockets make electrical connections between the device electrodes and the electrode pads of the burn-in substrate with contact pins that are arranged in the same matrix pattern as the device electrodes. To reduce cost, the contact pins of the burn-in sockets are generally provided only for the electrode parts required for burn-ins. However, burn-in sockets are still fairly expensive. The burn-in substrates are also expensive since multi-layer printed boards are used, and accordingly burn-in substrates that mount a plurality of burn-in sockets are very expensive.

Examples of burn-in substrates realized by multi-layer printed boards are disclosed in Japanese Publication for Unexamined Patent Application Nos. 68557/1997 (Tokukaihei 9-68557, published on Mar. 11, 1997) and 221234/2000 (Tokukai 2000-221234, published on Aug. 11, 2000), and Japanese Patent No. 3392783 (published on Jan. 26, 2001).

The burn-in test is carried out to find and remove potential defective products that may cause initial failures with high probability. Therefore, the burn-in test assumes the presence of defective semiconductor devices. In some type of defects, an overcurrent may flow across $V_{DD}$ and GND of the semiconductor device to burn the burn-in substrate or burn-in sockets.

Conventional high-power devices have consumption current of about 30 amperes. Therefore, in order to supply current, one or more conductor layers of a multi-layer printed board realizing the burn-in substrate has been used as the wiring layer for $V_{DD}$ and GND. However, since the thickness of the conductor layer (copper foil) in the printed board is as thin as 35 μm to 70 μm, it has been difficult to supply power to high power devices which consume a large current exceeding 100 amperes. Moreover, due to a current loss which increases as the square of a current value with respect to the conductor resistance, a problem arises where, for example, it is impossible to quickly follow voltage drop, heat generation of wiring conductors, and changes in consumption current as a result of a change in the operation state of the semiconductor devices.

Furthermore, since the maximum current capacity of wiring layers have no margin against the normal consumption current of the semiconductor devices, even a slight overcurrent generated by a device defect may quickly damage the burn-in substrate before the over current protector (OCP) of the power supply units that supply $V_{DD}$ operates.

Since it is almost impossible to repair such burn-out, a part of or the whole of the burn-in substrate becomes unusable when it is damaged by burn-out. Especially, high power devices that consume a large current have a high risk of burn-outs, and any incurred loss will be expensive.

SUMMARY OF THE INVENTION

An object of the present invention is provide a burn-in substrate and a burn-in device, especially a burn-in device used for the burn-in of high power devices, with which a risk of burn-out in the burn-in substrate or burn-in sockets can be reduced, and a loss caused by the burn-out can be reduced even if it occurs.

A burn-in substrate of the present invention is for use in a burn-in device which carries out a burn-in test on a semiconductor device, and, in order to achieve the foregoing object, the burn-in substrate is so structured that a plurality of semiconductor devices are detachably provided, and the burn-in substrate assists making contacts for power supply and signal input and output with respect to the semiconductor devices, the burn-in substrate including: a mother board that has wiring with which at least signal input and output are made with respect to the semiconductor devices; and a unit component, provided on the mother board for each of the semiconductor devices, for assisting signal input and output between the mother board and the semiconductor devices, and for assisting power supply to the semiconductor devices without passing through the mother board.

According to the above structure, input and output of signals between the mother board and each semiconductor device subjected to a burn-in test are carried out via the unit component. Large-current driving main power is supplied without passing through the mother board.

Here, the mother board is not involved in the exchange of large-current driving main power, even though it is realized by a printed board to provide wiring for signal input and output. This greatly reduces the risk of burn-outs in carrying out a burn-in on high power devices. Furthermore, despite that the mother board requires a large area, it only handles relatively weak current. This greatly reduces the number of layers in realizing the mother board by a multi-layer board, thereby reducing the cost of manufacture.

Large-current driving main power is supplied to each semiconductor device via the unit component without passing through the mother board (for example, by passing metal rods (bus bars) separately provided from the mother board). Here, since the current produced by the driving main power flows into the unit component for each semiconductor device, the amount of current flow can be reduced compared with the case that the driving main power is supplied through the mother board provided for a plurality of semiconductor devices, with the result that the risk of burn-outs due to overcurrent is reduced. Note that, in the case that the semiconductor device requires a supply of small-current auxiliary power in addition to the main power, the mother board may supply auxiliary power in addition to supplying signal input and output.

Moreover, even if a burn-out occurs due to overcurrent in a unit component mounting a semiconductor device in which a defect has occurred during a burn-in, the damage of burn-out is caused only in this unit component. Accordingly, it will not be necessary to replace the whole burn-in substrate, thereby reducing damages caused by the burn-out.

Additional objects, features, and strengths of the present invention will be made clear by the description below. Further, the advantages of the present invention will be evident from the following explanation in reference to the drawings.

BRIEF DESCRIPTION OF THE DRAWINGS

FIG. 1(a) is a plan view showing a structure of a burn-in substrate, and FIG. 1(b) is a side view showing the structure of the burn-in substrate.

DESCRIPTION OF THE EMBODIMENTS

One embodiment of the present invention is explained below based on the figures.

Figure 2A:
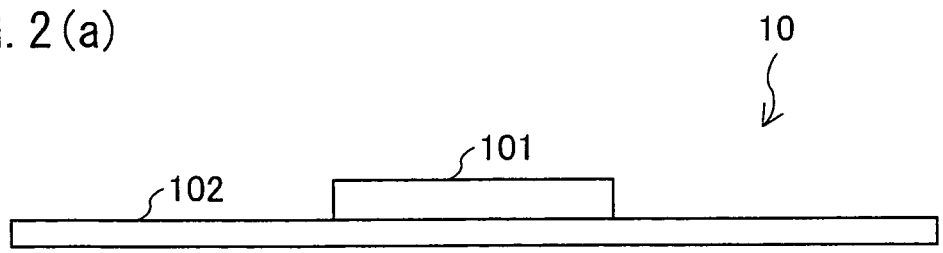
FIG. 2(a) is a side view showing a structure of a semiconductor device.
Figure 2B:
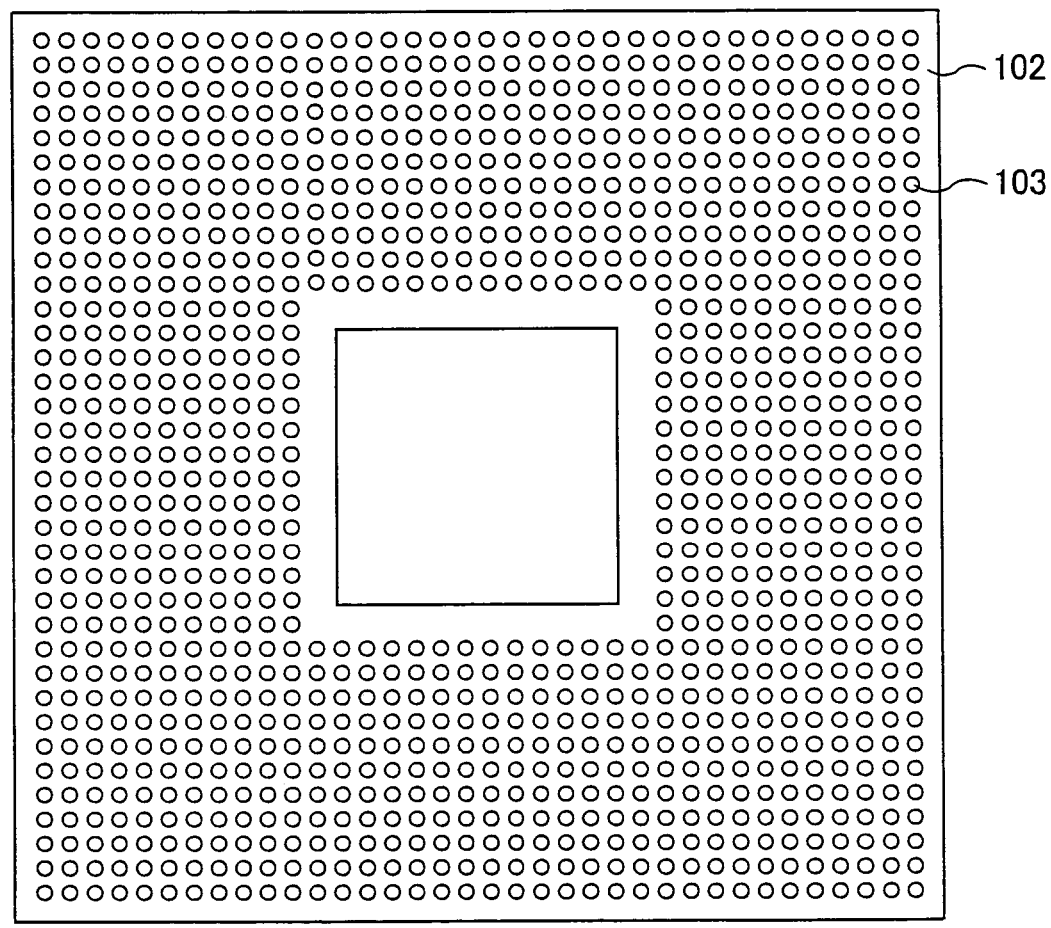
FIG. 2(b) is a bottom view showing the structure of the semiconductor device.

First, a structure of a semiconductor device is explained with reference to FIG. 2(a) and FIG. 2(b). A semiconductor device 10 is structured to include a semiconductor chip 101 mounted on a device substrate 102, as shown in FIG. 2(a). A multiplicity of electrode pads 103, which are arranged in the form of a matrix, are formed on the back face of the device substrate 102 (opposite the surface mounting the semiconductor chip 101), and these electrode pads are connected with the printed wiring formed on the front face of the device substrate 102 (the surface mounting the semiconductor chip 101).

It should be noted that not all electrode pads 103 on the back of the device substrate 102 are used in a burn-in. For example, about 100 are used for the power supply, about another 100 are used for GND, and another 100 or so are used for the signal input and output.

Next, a burn-in device that carries out a burn-in on the semiconductor device 10 is explained below.

Figure 3A:
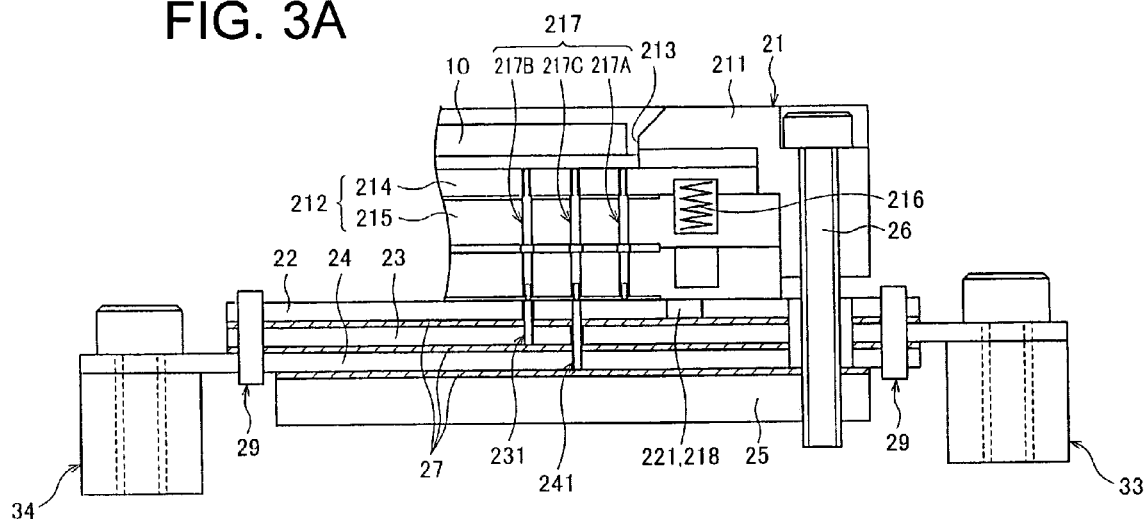
FIG. 3A is a view illustrating a main structure of a device driving unit used for the burn-in substrate and FIG. 3B is an enlarged portion of FIG. 3A to illustrate more clearly the connections between an example device driving unit and an example socket.
Figure 3B:
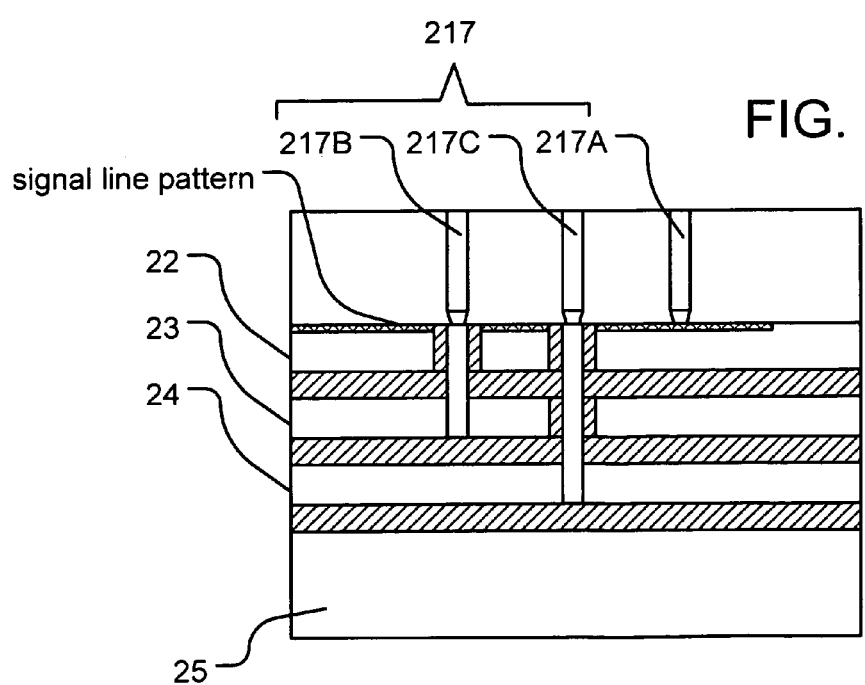
Figure 4:
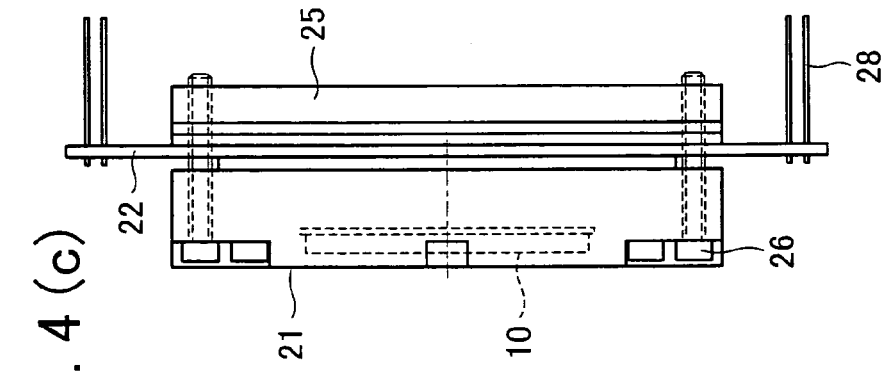
FIG. 4(a) is a plan view showing a structure of the device driving unit.
FIG. 4(b) is a front view showing the structure of the device driving unit.
FIG. 4(c) is a side view showing the structure of the device driving unit.
Figure 4:
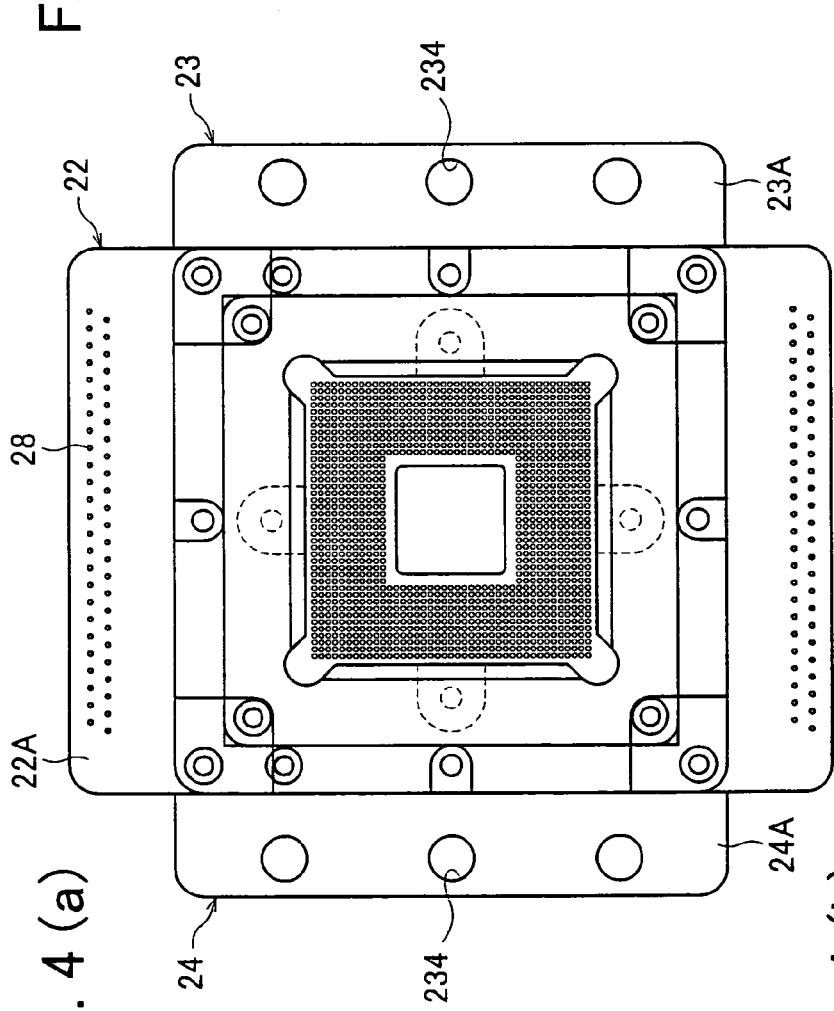
Figure 4:
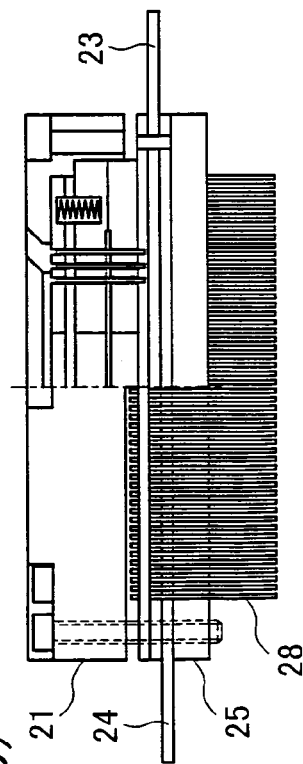

A burn-in device according to this embodiment has a burn-in substrate. The burn-in substrate includes a device driving unit 20 and a mother board 30 in order to supply power and the input and output of signals to and from a semiconductor device 10 to be tested on the burn-in device, as shown in FIG. 1(a). Referring to FIG. 3 through FIG. 5, the following will describe a structure of the device driving unit 20.

The semiconductor device 10, which is a high-power device, generally employs the BGA or LGA package style. A burn-in is performed by attaching the semiconductor device 10 on a socket that can easily attach or detach itself to and from the semiconductor device 10. The device driving unit 20 employs the socket system that can accommodate BGA and LGA, as described below in this embodiment.

The device driving unit 20 includes a socket 21, a distribution substrate 22, a device-driving main power conductor plate 23, a grounding conductor plate 24, and a reinforcing plate 25, which are stacked in this order from the top (from the surface mounting the semiconductor device 10). These components are attached to the reinforcing plate 25 with a socket attachment screw 26. Between the distribution substrate 22 and the device-driving main power conductor plate 23 is interposed an insulative film 27. The insulative film 27 is also interposed between the device-driving main power conductor plate 23 and the grounding conductor plate 24. The reinforcing plate 25 should preferably be a highly rigid metal plate so that these substrates and conductor plates are not bent. In this case, the insulative film 27 is also placed between the grounding conductor plate 24 and the reinforcing plate 25.

The distribution substrate 22, which is realized by a printed board, is provided for the input and output of signals to and from the semiconductor device 10. The distribution substrate 22 is also used to supply device-driving auxiliary power (e.g., $VDD_2$ or $VDD_3$ produced by a current smaller than main power $VDD_1$ (main power VDD is denoted as $VDD_1$ when auxiliary power exists)).

On the front face of the distribution substrate 22 (the surface in contact with the socket 21) and in a region where the semiconductor device 10 is provided, a multiplicity of electrode pads (not shown except for $V_{DD}$ and GND), required for a burn-in, is provided in the same layout as the electrode layout on the back face of the semiconductor device 10. Between the electrode pads and pin headers 28 that are disposed on the both ends of the distribution substrate 22 is provided a wiring pattern for the input and output signals and the device-driving auxiliary power (e.g., $VDD_2$ or $VDD_3$ produced by a current smaller than main power). Through the distribution substrate 22, a multiplicity of holes of a suitable diameter is provided by being insulated from a wiring layer of the distribution substrate 22 and in positions corresponding to the electrode layout of $V_{DD}$ and GND.

For the device-driving main power conductor plate 23 and the grounding conductor plate 24, a metal plate with good electrical conductivity (for example, copper) is used. In light of the fact that the semiconductor device 10 is a high-power device and it requires a supply of large actuating current, it is preferable that the device-driving main power conductor plate 23 and the grounding conductor plate 24 be provided as a thick conductor plate (about 0.6 mm to 2.0 mm) in order to keep the conductor resistance low and suppress the resistance loss.

Figure 5A:
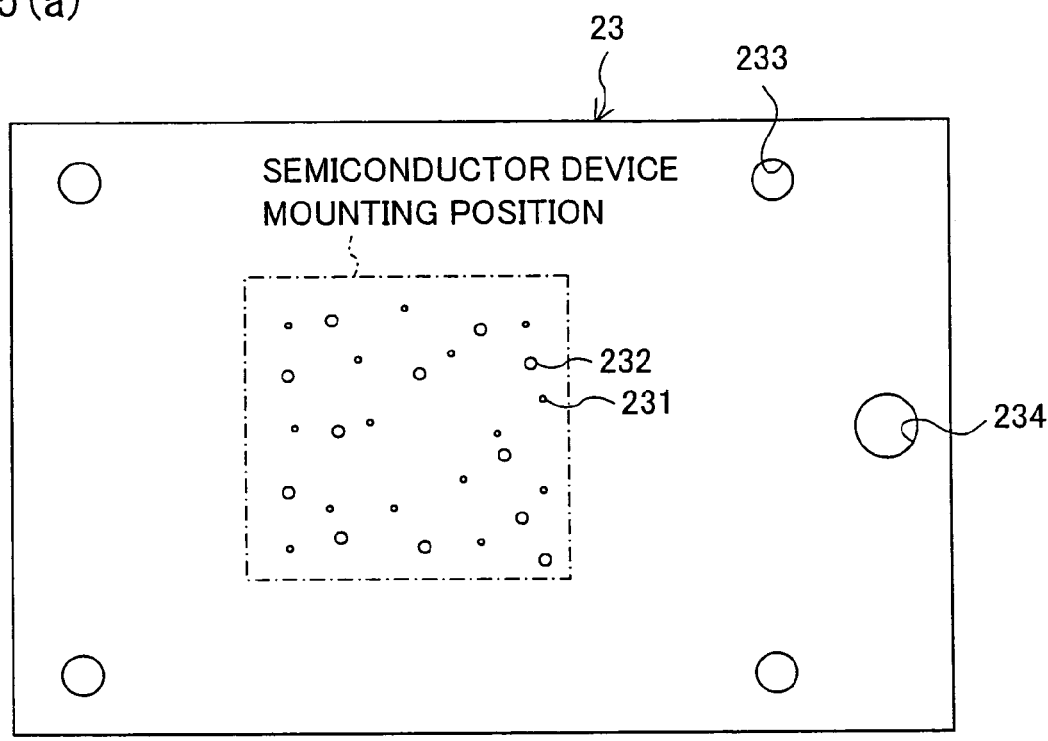
FIG. 5(a) is a plan view of a device-driving main power conductor plate in a device driving unit.

A multiplicity of conductor pins 231 and 241 are press-fitted in portions of the device-driving main power conductor plate 23 and the grounding conductor plate 24 where the semiconductor device 10 is provided, corresponding to the electrode layout of $V_{DD}$ and GND on the back face of the semiconductor device 10 (i.e., portions that coincide with the electrode layout of $V_{DD}$ and GND on the semiconductor device 10), as shown in FIG. 5(a) and (b). (Note that, in this figures, the number of conductor pins are reduced for simplicity). The conductor pins 231 and 241 are sized so that their tops are on the same level as the upper surface of the distribution substrate 22 when the distribution substrate 22, the device-driving main power conductor plate 23, and the grounding conductor plate 24 are assembled as the driving unit 20. Also, in this state, the pressed-fitted portions of the conductor pins 231 and 241 do not exceed the thickness of the device-driving main power conductor plate 23 or the grounding conductor plate 24.

Moreover, in the device-driving main power conductor plate 23, a through hole 232, which is greater in diameter than the conductor pin 241, is formed at a position where the conductor pin 241 extends to the grounding conductor plate 24. The through hole 232 is a point of no contact between the device-driving main power conductor plate 23 and the conductor pins 241 when the device-driving main power conductor plate 23 and the grounding conductor plate 24 are stacked, and it serves as an insulation gap to secure insulation between the device-driving main power conductor plate 23 and the conductor pins 241.

As for the press-fitting of the conductor pins 231 and 241 into the device-driving main power conductor plate 23 and the grounding conductor plate 24, a suitable method is to open pores through these conductor plates by etching, and press the conductor pins 231 and 241 into these pores.

Figure 5B:
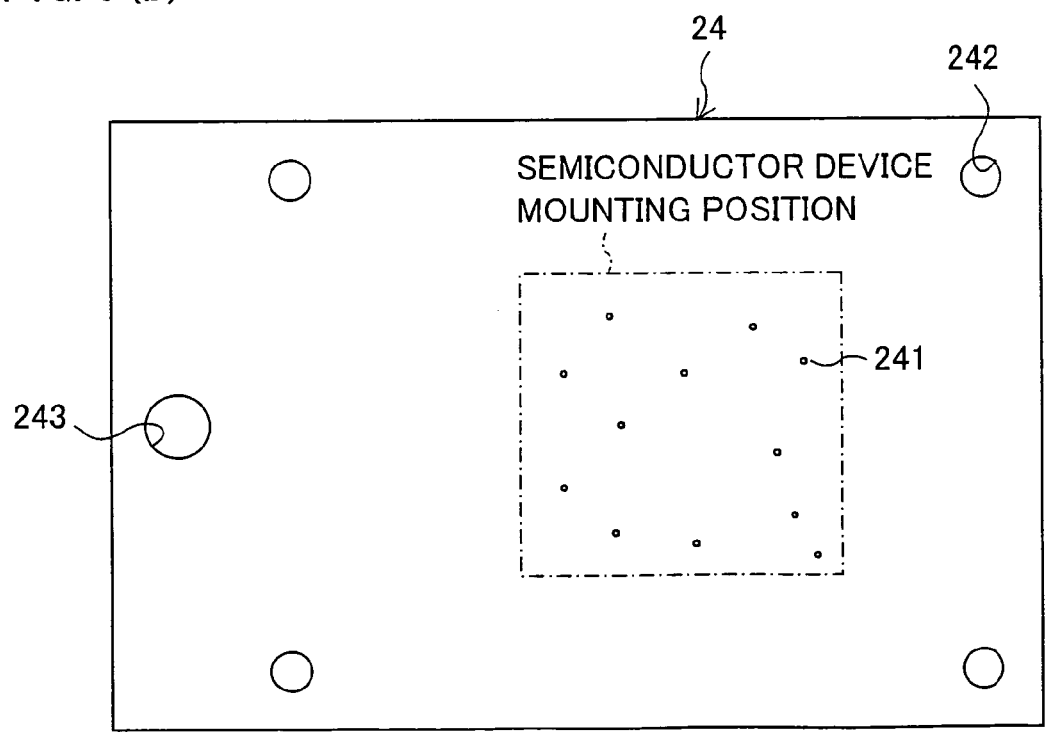
FIG. 5(b) is a plan view of a grounding conductor plate.

The distribution substrate 22, the device-driving main power conductor plate 23, and the grounding conductor plate 24 respectively have positioning reference holes for the position registration when they are stacked (a positioning reference hole 233 for the device-driving main power conductor plate 23 and a positioning reference hole 242 for the grounding conductor plate 24; see FIG. 5(a) and FIG. 5(b)). Position registration in the in-plane direction of the substrate can be accurately carried out by inserting an insulative positioning pin 29 into the positioning reference holes.

Moreover, the distribution substrate 22, the device-driving main power conductor plate 23, and the grounding conductor plate 24 are positioned such that, when they are stacked, portions corresponding to a mount position for the semiconductor device 10 in the direction of stack overlap in a predetermined direction. Further, the distribution substrate 22, the device-driving main power conductor plate 23, and the grounding conductor plate 24 have protrusions that do not overlap with one another in the direction of stack when they are stacked.

The distribution substrate 22 has a protrusion 22A on the opposing two sides of four sides of the device driving unit 20. The device-driving main power conductor plate 23 and the grounding conductor plate 24 have a protrusion 23A and a protrusion 24A, respectively, on the other two opposing sides. The pin headers 28 are provided on the protrusion 22A of the distribution substrate 22. The protrusion 23A of the device-driving main power conductor plate 23 has a power source connecting hole 234, and the protrusion 24A of the grounding conductor plate 24 has a GND connecting hole 243. The power source connecting hole 234 and the GND connecting hole 243 are connected with bus bars 33 and 34, which constitute a power source contact section and GND contact section of the burn-in device, as will be described later.

In the device driving unit 20, a stacking order of the distribution substrate 22, the device-driving main power conductor plate 23, and the grounding conductor plate 24 is not particularly limited. However, for ease of making contacts with the semiconductor device 10, it is preferable that the distribution substrate 22, the device-driving main power conductor plate 23, and the grounding conductor plate 24 are stacked in this order from the top (the nearest to the semiconductor device 10), taking into consideration that the grounding conductor plate 24 needs to have a greater thickness than the device-driving main power conductor plate 23 to accommodate a larger current flow through the grounding conductor plate 24 than through the device-driving main power conductor plate 23 when the GND of the auxiliary power supply ($V_{DD2}$, $V_{DD3}$) is shared by the grounding conductor plate 24. In this way, it is not necessary to lengthen the conductor pin that comes out of the lower layer conductor plate.

The socket 21 is provided in a region where the distribution substrate 22, the device-driving main power conductor plate 23, and the grounding conductor plate 24 overlap in a direction of stack.

As representatively shown in FIG. 3, the socket 21 has two major parts, an upper frame 211 and a lower base 212. The upper frame 211 is provided to anchor the socket 21 on the device driving unit 20 and to set the semiconductor device 10 for a burn-in. The upper surface of the upper frame 211 has a device frame 213 which is sized to fit the semiconductor device 10.

The lower base 212 is structured to include a device mounting base 214 for mounting the semiconductor device 10, and a base 215, wherein the device mounting base 214 floats on the base 215 with a spring 216 in between. Furthermore, in the lower base 212, contact pins 217 that are stretchable are inserted through the device mounting base 214 and the base 215. The contact pins 217 are arranged in the form of a matrix at the pitch of the electrode pads 103 on the back face of the semiconductor device 10.

Note that, when the socket 21 has the contact pins 217 that are formed in the form of a matrix as above, the socket 21 can be used for a variety of purposes regardless of the electrode layout of the semiconductor device 10. Alternatively, the contact pins 217 may be provided only in portions where they are required, according to the electrode layout of the semiconductor device 10. The socket 21, when fabricated according to the electrode layout of the semiconductor device 10, requires smaller numbers of contact pins 217 and thereby reduce manufacture cost of the socket 21.

With the socket 21 attached to the device driving unit 20, the socket 21 needs to be positioned relative to the position of the distribution substrate 22, the device-driving main power conductor plate 23, and the grounding conductor plate 24. For this purpose, a plurality of positioning projections 218 are formed on the back face of the base 215 in the socket 21, and the socket 21 is positioned on the distribution substrate 22 by fitting the positioning projections 218 to the positioning holes 221 of the distribution substrate 22.

The semiconductor device 10 to be subjected to a burn-in is mounted in the device mounting base 214 of the socket 21, and is positioned on the socket 21 by being fitted to the device frame 213. The semiconductor device 10 mounted in position is pressed down with a pressing mechanism (not illustrated). The force of pressure lowers the device mounting base 214, causing the electrode pads 103 on the back face of the semiconductor device 10 to contact the upper end of the contact pins 217.

In the semiconductor device 10, the electrode pads 103 for signal input and signal output contact the electrode pads (not shown) on the upper face of the distribution substrate 22 via contact pins 217A. Via contact pins 217B, the electrode pads 103 for current supply contact the conductor pins 231 that are press-fit into the device-driving main power conductor plate 23. Via contact pins 217C, the electrode pads 103 for GND contact the conductor pins 241 that are press-fit into the grounding conductor plate 24.

With the device driving unit 20 of the above structure, the semiconductor device 10 operates on input and output signals and a small drive current supplied from the distribution substrate 22, and on a large main current for driving supplied from the device-driving main power conductor plate 23 and the grounding conductor plate 24. In the device-driving main power conductor plate 23 and the grounding conductor plate 24, a considerably large conductor cross-sectional area can be provided as compared with conventional examples when they are made from a conductor plate of a large thickness (for example, a copper plate with a thickness of about 1 mm) instead of using a wiring layer of the printed board. In this way, a resistance loss in the conductors can be minimized and a change in consumption current as a result of a change in operation state can be quickly followed even when the supply current increases, thus stably supplying power.

Moreover, the device-driving main power conductor plate 23 and the grounding conductor plate 24 can have any thickness, making it possible to easily accommodate large-current and low-voltage devices of the future by increasing the thickness (or by increasing the number of conductor plates). Thus, with the use of the device driving unit 20 in a burn-in device, miniaturization of a direct-current power supply unit or a cooling device can be attained in the burn-in device.

Next, description is made as to a structure of the mother board 30, and how the device driving unit 20 is attached to the mother board 30, with reference to FIG. 1(*a*) and FIG. 1(*b*).

In order to carry out a burn-in test simultaneously for a plurality of semiconductor devices 10, the mother board 30 is made from a printed board with an area sufficient to mount a plurality of device driving units 20. In addition, the mother board 30 has a card edge 31 along one of its sides. The card edge 31 is inserted and fitted to a card edge connector (not shown) in a burn-in device, so as to transfer device-driving auxiliary power and input and output signals.

On predetermined portions of the mother board 30 where the device driving unit 20 is disposed, socket headers 32 are formed to be fitted to the pin headers 28 provided on the both ends of the distribution substrate 22 of the device driving unit 20. Between the card edge 31 and the socket headers 32, a wiring pattern for device-driving auxiliary power and input and output signals is installed.

The wiring for $V_{DD}$ and GND which supply a large current to the device-driving main power conductor plate 23 and the grounding conductor plate 24 of the device driving unit 20 is realized by the bus bars 33 and 34, which are rod members made of good electrical conductive material (for example, copper) and placed on the mother board 30 by being insulated from the device-driving auxiliary power and input and output signals. The bus bars 33 for $V_{DD}$ ("$V_{DD}$ bus bars 33" hereinafter) and bus bars 34 for GND ("GND bus bars 34" hereinafter) are fixed in position at predetermined intervals.

The $V_{DD}$ bus bars 33 and GND bus bars 34 have an end (on the side of the card edge 31) that is processed in the shape of a cylinder so that they can serve as the plug for a large-current socket (not shown). The other end of the $V_{DD}$ bus bars 33 and GND bus bars 34 extends to a predetermined position where the device driving unit 20 is formed, and has an internal thread so that it can be screwed to the device-driving main power conductor plate 23 and the grounding conductor plate 24 of the device driving unit 20.

As shown in FIG. 1(*a*), in this embodiment, in order to make easy attachment and detachment of the device driving unit 20, all bus bars 33 and 34 are disposed within the same plane. For this reason, depending on the position of the device driving unit 20 relative to the card edge 31, the intervals between the VDD bus bars 33 and GND bus bars 34 may vary. Specifically, while the device driving unit 20 that is closest to the card edge 31 enables its $V_{DD}$ bus bar 33 and GND bus bar 34 to be disposed at such an interval that they can be directly connected to this device driving unit 20, the intervals between the $V_{DD}$ bus bars 33 and GND bus bars 34 increase for the other device driving units 20 as the distance from the card edge 31 increases. For this reason, the device driving units 20 that are farther from the card edge 31 are connected to the $V_{DD}$ bus bars 33 and GND bus bars 34 with adapter conductors 35 and 36 for correcting the intervals between the $V_{DD}$ bus bars 33 and GND bus bars 34.

Alternatively, the $V_{DD}$ bus bars 33 and GND bus bars 34 may be bent to adjust their intervals. In this way, it is possible to connect all device driving units 20 directly with the $V_{DD}$ bus bars 33 and GND bus bars 34, without using the adapter conductors 35 and 36.

The device driving unit 20 is mounted on the mother board 30 by first inserting and fitting the pin headers 28 of the distribution substrate 22 of the device driving unit 20 to the socket headers 32 of the mother board 30, and then by screwing the terminal parts (that is, the protrusions 23A and 24A) of the device-driving main power conductor plate 23 and the grounding conductor plate 24 of the device driving unit 20 to the $V_{DD}$ bus bars 33 and GND bus bars 34 (or the adapter conductors 35 and 36) and thereby making all electrical contacts. This enables the device driving unit 20 to be easily attached and detached to and from the mother board 30.

Note that, the foregoing described the device driving unit 20 in which a printed board is used only for the distribution substrate 22 through which signals are input and output, and conductor plates, such as the device-driving main power conductor plate 23 and the grounding conductor plate 24, are used for members supplied with operating main power. However, the present invention also encompasses a device driving unit in which a particular layer of a multi-layer printed board is used for members supplied with operating main power.

Specifically, in using the wiring of a multi-layer printed board in order to supply operating main power, a current flow can be reduced and burn-outs can be prevented when the wiring is formed within a device driving unit that corresponds to a single semiconductor device, as compared with the case that the wiring for supplying main power is formed on the mother board that is common to a plurality of semiconductor devices.

As above, a burn-in substrate according to the present embodiment is for use in a burn-in device which carries out a burn-in test on a semiconductor device, and the burn-in substrate is so structured that a plurality of semiconductor devices are detachably provided, and the burn-in substrate assists making contacts for power supply and signal input and output with respect to the semiconductor devices, the burn-in substrate including: a mother board that has wiring with which at least signal input and output are made with respect to the semiconductor devices; and a unit component, provided on the mother board for each of the semiconductor devices, for assisting signal input and output between the mother board and the semiconductor devices, and for assisting power supply to the semiconductor devices without passing through the mother board.

According to the above structure, input and output of signals between the mother board and each semiconductor device subjected to a burn-in test are carried out via the unit component. Large-current driving main power is supplied without passing through the mother board.

Here, the mother board is not involved in the exchange of large-current driving main power, even though it is realized by a printed board to provide wiring for signal input and output. This greatly reduces the risk of burn-outs in carrying out a burn-in on high power devices. Furthermore, despite that the mother board requires a large area, it only handles relatively weak current. This greatly reduces the number of layers in realizing the mother board by a multi-layer board, thereby reducing the cost of manufacture.

Large-current driving main power is supplied to each semiconductor device via the unit component without passing through the mother board (for example, by passing through metal rods (bus bars) separately provided from the mother board). Here, since the current produced by the driving main power flows into the unit component for each semiconductor device, the amount of current flow can be reduced compared with the case that the driving main power is supplied through the mother board provided for a plurality of semiconductor devices, with the result that the risk of burn-outs due to overcurrent is reduced. Note that, in the case that the semiconductor device requires a supply of small-current auxiliary power in addition to the main power, the mother board may supply auxiliary power in addition to making signal input and output.

Moreover, even if a burn-out occurs due to overcurrent in a unit component mounting a semiconductor device in which a defect has occurred during a burn-in, the damage of burn-out is caused only in this unit component. Accordingly, it will not be necessary to replace the whole burn-in substrate, thereby reducing damages caused by the burn-out.

Moreover, in the burn-in substrate, the unit component includes: a distribution substrate, provided with wiring electrically connected with the wiring formed on the mother board, for making signal input and output with respect to the semiconductor devices; and a power supplying conductor plate and a grounding conductor plate, for supplying a main power for operation to the semiconductor devices, the distribution substrate, the power supplying conductor plate, and the grounding conductor plate being stacked respectively via an insulator, and the unit component on the distribution substrate has electrode pads for inputting and outputting operating signals, and the unit component has contact electrodes on the power supplying conductor plate and the grounding conductor plate, wherein the electrode pads and the contact electrodes are provided within a same plane so as to correspond to an electrode layout of the semiconductor devices.

According to the above structure, the semiconductor device receives input and output signals from the distribution substrate, and operates on the large-current driving main power supplied from the power supplying conductor plate and the grounding conductor plate.

The power supplying conductor plate and the grounding conductor plate for supplying the driving main power to the semiconductor devices do not use the wiring of the distribution substrate but are realized by a thick conductor plate (for example, a copper plate with a thickness of about 1 mm), securing a considerably large conductor cross sectional area compared with a conventional structure. In this way, a resistance loss in the conductors can be minimized and a change in consumption current as a result of a change in operation state can be quickly followed even when the supply current increases, thus stably supplying power.

Moreover, since the distribution substrate, for which a printed board (generally, a multi-layer substrate) is used, does not require wiring for the main power, the number of layers and thereby manufacture cost can be reduced.

In conventional burn-in substrates, in an area where the semiconductor devices are attached (usually using a socket), a high wiring density is required and multi-layering of the wiring layer becomes inevitable since the electrodes are arranged according to the layout of the electrode pads of the semiconductor devices. On the other hand, in the above structure, portions of such high wiring density are formed in the distribution substrate of the unit component, and the distribution substrate is connected with the wiring of the mother board after the wiring of the distribution substrate is expanded and its wiring density reduced. Therefore, the mother board itself has a relatively low wiring density. Since the area of the distribution substrate itself is smaller than that of the mother board (area ratio of about 1/30), an increase in cost is small even if the distribution substrate is a multi-layer substrate. That is, the distribution substrate can be made less expensively than realizing the mother board as a multi-layer substrate by providing high-wiring-density portions in a large area of the mother board.

Moreover, electrode contacts for the mother board and the semiconductor device can easily be matched by suitably designing the wiring of the distribution substrate, even if the layout of the electrode pads is different according to the kind of semiconductor device subjected to a burn-in. This enables the mother board to be commonly provided regardless of the type of semiconductor device, thereby reducing cost.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A burn-in substrate for use in a burn-in device which carries out a burn-in test on a semiconductor device, the burn-in substrate being so structured that a plurality of semiconductor devices are detachably provided, and the burn-in substrate providing contacts for power supply and signal input and output with respect to the semiconductor devices, the burn-in substrate comprising:
a mother board that has wiring with which at least signal input and output are made with respect to the semiconductor devices; and
a unit component, provided on the mother board for each of the semiconductor devices, for providing signal input and output between the mother board and the semiconductor devices, and for providing power supply to the semiconductor devices without passing through the mother board.

2. A burn-in substrate in accordance with claim 1, wherein the unit component includes:
- a distribution substrate, provided with wiring electrically connected with the wiring formed on the mother board, for making signal input and output with respect to the semiconductor devices; and
- a power supplying conductor plate and a grounding conductor plate, for supplying a main power for operation to the semiconductor devices,
- the distribution substrate, the power supplying conductor plate, and the grounding conductor plate being stacked via an insulator, and
- wherein the distribution substrate includes
  - electrode pads for inputting and outputting operating signals,
  - first contact electrodes electrically connected to the power supplying conductor plate, and
  - second contact electrodes connected to the grounding conductor plate, with the electrode pads, the first contact electrodes and the second contact electrodes being provided within a plane and configured in a manner corresponding to an electrode layout of the semiconductor device.

3. A burn-in device which carries out a burn-in test on a semiconductor device,
the burn-in device comprising:
- a burn-in substrate, being so structured that a plurality of semiconductor devices are detachably provided, assisting making contacts for power supply and signal input and output with respect to the semiconductor devices, the burn-in substrate including:
- a mother board that has wiring with which at least signal input and output are made with respect to the semiconductor devices; and
- a unit component, provided on the mother board for each of the semiconductor devices, for assisting signal input and output between the mother board and the semiconductor devices, and for assisting power supply to the semiconductor devices without passing through the mother board.

4. A semiconductor device burn-in assembly comprising:
- a mother board configured for receiving and distributing test signals to a semiconductor device under test;
- a first bus bar provided above and separated from a primary surface of the mother board for power voltage distribution, whereby the power voltage is distributed without passing through the mother board;
- a second bus bar provided above and separated from the primary surface of the mother board for ground voltage distribution;
- a distribution substrate provided on the mother board for establishing electrical connections between the semiconductor device under test and the mother board, the first bus bar and the second bus bar;
- a test socket mounted on the distribution substrate for receiving the semiconductor device under test.

5. The semiconductor device burn-in assembly according to claim 4 further comprising:
- a plurality of distribution substrates having a width W are provided on the mother board;
- a plurality of first bus bars provided above the mother board for power voltage distribution;
- a plurality of second bus bars provided above the mother board for ground voltage distribution;
- an adapter conductor for mounting a distribution substrate on a first bus bar and a second bus bar wherein the bus bars are separated by a distance greater than W.

* * * * *